(12) United States Patent
Choi et al.

(10) Patent No.: US 10,475,866 B2
(45) Date of Patent: Nov. 12, 2019

(54) ORGANIC LIGHT EMITTING DISPLAY DEVICE

(71) Applicant: LG Display Co., Ltd., Seoul (KR)

(72) Inventors: Seung Kyu Choi, Paju-si (KR); Nam Wook Cho, Paju-si (KR)

(*) Notice: Subject to any disclaimer, the term of this patent is extended or adjusted under 35 U.S.C. 154(b) by 0 days.

(21) Appl. No.: 15/716,874

(22) Filed: Sep. 27, 2017

(65) Prior Publication Data
US 2018/0097049 A1  Apr. 5, 2018

(30) Foreign Application Priority Data

Sep. 30, 2016 (KR) .................. 10-2016-0127160

(51) Int. Cl.
*H01L 29/08* (2006.01)
*H01L 27/32* (2006.01)
(Continued)

(52) U.S. Cl.
CPC ...... *H01L 27/3246* (2013.01); *H01L 27/3258* (2013.01); *H01L 51/5206* (2013.01);
(Continued)

(58) Field of Classification Search
CPC . H01L 27/32; H01L 27/3246; H01L 27/3258; H01L 51/5206; H01L 51/5225
See application file for complete search history.

(56) References Cited

U.S. PATENT DOCUMENTS

| 9,029,838 B2 | 5/2015 | Lim et al. | |
| 2012/0074435 A1* | 3/2012 | Ha | H01L 51/5203 257/88 |

(Continued)

FOREIGN PATENT DOCUMENTS

| CN | 104425766 A | 3/2015 |
| CN | 105514144 A | 4/2016 |
| WO | 2016/060089 A1 | 4/2016 |

OTHER PUBLICATIONS

Office Action dated Jun. 3, 2019 related to the corresponding Chinese Patent application 201710909368.3. (11 pages) and translation (8 pages).

*Primary Examiner* — Phuc T Dang
(74) *Attorney, Agent, or Firm* — Polsinelli PC

(57) ABSTRACT

Disclosed are an organic light emitting display device and a method of manufacturing the same. The organic light emitting display device includes a thin film transistor (TFT) including a gate electrode and a source electrode provided on a substrate, a planarization layer provided on the TFT to have a step height, an anode electrode provided on the planarization layer and connected to the source electrode, an organic light emitting layer provided on an upper surface of the anode electrode, and a cathode electrode provided on the organic light emitting layer. The planarization layer includes a first area and a second area, provided at different heights, and a third area including an inclined surface between the first area and the second area. Also, the method includes forming a planarization layer on the source electrode to have a step height. The forming of the planarization layer includes forming the planarization layer including a first area and a second area, provided at different heights, and a third area including an inclined surface between the first area and the second area. Accordingly, the anode electrode provided on the inclined surface of the third area reflects light which is emitted from the organic light emitting layer and moves to a side surface of the organic light emitting layer, thereby enhancing emission efficiency.

16 Claims, 12 Drawing Sheets

(51) Int. Cl.
  *H01L 51/52* (2006.01)
  *H01L 51/56* (2006.01)
(52) U.S. Cl.
  CPC .......... *H01L 51/5225* (2013.01); *H01L 51/56* (2013.01); *H01L 51/5265* (2013.01)

(56) References Cited

U.S. PATENT DOCUMENTS

| | | |
|---|---|---|
| 2015/0060820 A1 | 3/2015 | Takagi et al. |
| 2015/0206928 A1 | 7/2015 | Kimura et al. |
| 2016/0071913 A1* | 3/2016 | Kim ................... H01L 27/3246 257/40 |
| 2016/0093829 A1* | 3/2016 | Kim ................... H01L 51/5253 257/40 |
| 2016/0118449 A1* | 4/2016 | Sato ................... H01L 27/3246 257/89 |
| 2016/0270209 A1* | 9/2016 | Cho ....................... G06F 1/1652 |
| 2017/0012087 A1* | 1/2017 | Seo ..................... H01L 27/3227 |
| 2017/0075155 A1* | 3/2017 | Oikawa ............. G02F 1/133555 |
| 2017/0243932 A1 | 8/2017 | Ohara et al. |
| 2017/0278913 A1* | 9/2017 | Zhang ................ H01L 27/3246 |

* cited by examiner

ORGANIC LIGHT EMITTING DISPLAY DEVICE

CROSS-REFERENCE TO RELATED APPLICATION

This application claims the benefit of the Korean Patent Application No. 10-2016-0127160 filed on Sep. 30, 2016, which is hereby incorporated by reference in its entirety as if fully set forth herein.

BACKGROUND

Field of the Disclosure

The present disclosure relates to a display device, and more particularly, to an organic light emitting display device and a method of manufacturing the same.

Description of the Background

Examples of flat panel display (FPD) devices include liquid crystal display (LCD) devices, plasma display panels (PDPs), and organic light emitting display devices, etc. Recently, electrophoretic display (EPD) devices have been widely used as one type of FPD device.

In such display devices, the organic light emitting display devices are self-emitting devices and have a low power consumption, a fast response time, a high emission efficiency, a high luminance, and a wide viewing angle, thereby attracting attention as next-generation display devices.

The organic light emitting display devices are classified into a top emission type and a bottom emission type, based on a transmission direction of light emitted from an organic light emitting device. In the bottom emission type, a circuit element is disposed between a light emitting layer and an image displaying surface, and for this reason, an aperture ratio becomes lowered due to the circuit element. On the other hand, in the top emission type, the circuit element is not disposed between the light emitting layer and the image displaying surface, and thus, an aperture ratio tends to be enhanced.

FIG. 1 is a schematic cross-sectional view of a related art top emission type organic light emitting display device.

As seen in FIG. 1, a planarization layer 1, an anode electrode 2, a bank 3, an organic light emitting layer 4, and a cathode electrode 5 are sequentially formed on a substrate (not shown).

The planarization layer 1 planarizes a thin film transistor (TFT) layer (not shown) provided on the substrate, and the anode electrode 2 is formed on the planarization layer 1.

The bank 3 is formed on the anode electrode 2 and defines a pixel area. The bank 3 is formed on each of one side and the other side of the anode electrode 2 to expose a top of the anode electrode 2.

The organic light emitting layer 4 is formed in the pixel area defined by the bank 3, and the cathode electrode 5 is formed on the organic light emitting layer 4.

In the top emission type, light emitted from the organic light emitting layer 4 is reflected by the anode electrode 2 and travels via the cathode electrode 5. Therefore, the anode electrode 2 is formed of a material which has high reflectivity, and the cathode electrode 5 is formed of a transparent conductive material.

The related art top emission type organic light emitting display device has the following problems.

In the top emission type of the related art, about 30% of the light emitted from the organic light emitting layer 4 is output, and the other light moves to a side surface of the organic light emitting layer 4 and is lost.

That is, since the anode electrode 2, the organic light emitting layer 4, and the cathode electrode 5 are formed in a planarized region on the planarization layer 1, output light is limited, and for this reason, emission efficiency is not high.

SUMMARY

Accordingly, the present disclosure is directed to provide an organic light emitting display device and a method of manufacturing the same that substantially obviate one or more problems due to limitations and disadvantages of the related art.

An aspect of the present disclosure is directed to provide an organic light emitting display device and a method of manufacturing the same, which supply light lost in an organic light emitting layer to a micro-cavity and thus increase emission efficiency, thereby reducing consumption power and increasing a lifetime of a product.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including a thin film transistor (TFT) including a gate electrode and a source electrode provided on a substrate, a planarization layer provided on the TFT to have a step height, an anode electrode provided on the planarization layer and connected to the source electrode, an organic light emitting layer provided on an upper surface of the anode electrode, and a cathode electrode provided on the organic light emitting layer. The planarization layer includes a first area and a second area, provided at different heights, and a third area including an inclined surface between the first area and the second area.

In another aspect of the present disclosure, there is provided a method of manufacturing an organic light emitting display device including forming a gate electrode on a substrate, forming an interlayer dielectric on the gate electrode and forming a source electrode on the interlayer dielectric, forming a planarization layer on the source electrode to have a step height, forming an anode electrode connected to the source electrode on the planarization layer, forming an organic light emitting layer on the anode electrode, and forming a cathode electrode on the organic light emitting layer. The forming of the planarization layer includes forming the planarization layer including a first area and a second area, provided at different heights, and a third area including an inclined surface between the first area and the second area.

In a further aspect of the present disclosure, there is provided An organic light emitting display device comprises a thin film transistor (TFT) including a gate electrode and a source electrode provided on a substrate; a planarization layer disposed on the TFT and having first, second, and third areas, wherein each area has different step heights to form a micro-cavity structure, and the first area is disposed in an emission area of the organic light emitting display device; an anode electrode on the planarization layer and connected to the source electrode; an organic light emitting layer on the anode electrode; and a cathode electrode on the organic light emitting layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspects of the disclosure and together with the description serve to explain the principle of the disclosure.

In the drawings.

DETAILED DESCRIPTION OF THE DISCLOSURE

Figure 1:
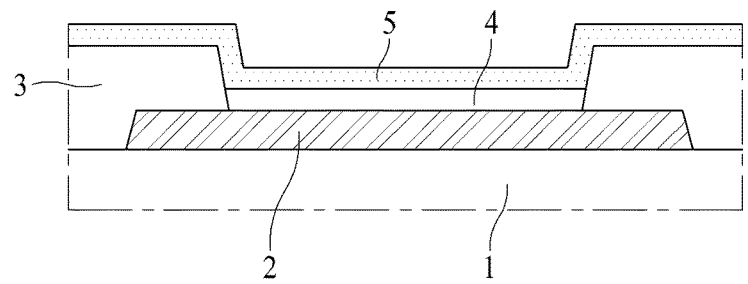
FIG. 1 is a schematic cross-sectional view of a related art top emission type organic light emitting display device.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of the present disclosure will be described in detail with reference to the accompanying drawings.

Figure 2:
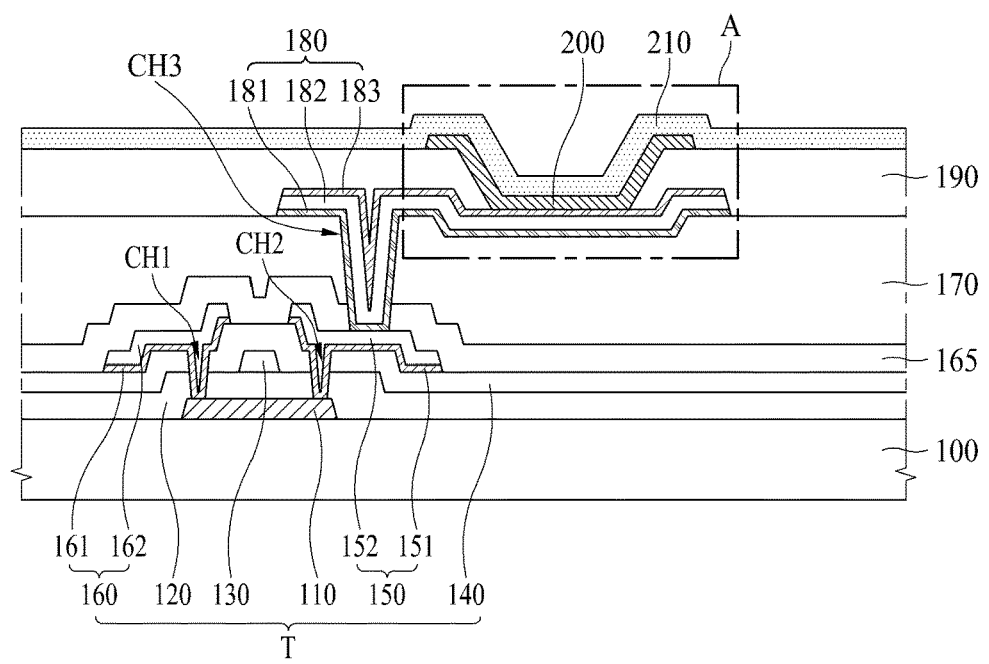
FIG. 2 is a cross-sectional view of an organic light emitting display device according to an aspect of the present disclosure.

FIG. 2 is a cross-sectional view of an organic light emitting display device according to an aspect of the present disclosure.

As illustrated in FIG. 2, the organic light emitting display device according to an aspect of the present disclosure may include a thin film transistor (TFT) layer T, a passivation layer 165, a planarization layer 170, an anode electrode 180, a bank 190, an organic light emitting layer 200, and a cathode electrode 210, which are formed on a substrate 100.

The TFT layer T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Although not shown, a light blocking layer may be further formed between the substrate 100 and the active layer 110, and in this case, external light incident through a bottom of the substrate 100 may be blocked by the light blocking layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiO$_x$), silicon nitride (SiN$_x$), or a multilayer thereof, but is not limited thereto.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer which includes one of molybdenum (Mo), aluminum (Al), chromium (Cr), gold (Au), titanium (Ti), nickel (Ni), neodymium (Nd), or copper (Cu), or an alloy thereof, but is not limited thereto.

The interlayer dielectric 140 may be formed on the gate electrode 130. The interlayer dielectric 140 may be formed of an inorganic insulating material (for example, silicon oxide (SiO$_x$), silicon nitride (SiN$_x$), or a multilayer thereof) which is the same as that of the gate insulation layer 120, but is not limited thereto.

The source electrode 150 and the drain electrode 160 may be formed on the interlayer dielectric 140 to face each other. The gate insulation layer 120 and the interlayer dielectric may include a first contact hole CH1, exposing one area of the active layer 110, and a second contact hole CH2 which exposes the other area of the active layer 110. Accordingly, the source electrode 150 may be connected to the other area of the active layer 110 through the second contact hole CH2, and the drain electrode 160 may be connected to the one area of the active layer 110 through the first contact hole CH1.

The source electrode 150 may be formed of a multilayer which includes a bottom source electrode 151 and a top source electrode 152.

The bottom source electrode 151 may be formed between the interlayer dielectric 140 and the top source electrode 152 to enhance an adhesive force between the interlayer dielectric 140 and the top source electrode 152. Also, the bottom source electrode 151 may protect a lower surface of the top source electrode 152, thereby preventing the lower surface of the top source electrode 152 from being corroded. Therefore, an oxidation rate of the bottom source electrode 151 may be lower than that of the top source electrode 152. That is, a material of the bottom source electrode 151 may be a material having a corrosion resistance which is stronger than that of a material of the top source electrode 152. As described above, the bottom source electrode 151 may act as an adhesion promotor or an anti-corrosion layer and may be formed of an alloy (MoTi) of molybdenum (Mo) and titanium (Ti), but is not limited thereto.

The top source electrode 152 may be formed on a top of the bottom source electrode 151. The top source electrode 152 may be formed of copper (Cu) which is metal having a low resistance, but is not limited thereto. The top source electrode 152 may be formed of metal having a resistance which is relatively lower than that of the bottom source electrode 151. In order to decrease a total resistance of the source electrode 150, a thickness of the top source electrode 152 may be set thicker than that of the bottom source electrode 151.

Similar to the source electrode 150, the drain electrode 160 may be formed of a multilayer which includes a bottom drain electrode 161 and a top drain electrode 162.

The bottom drain electrode 161 may be formed between the interlayer dielectric 140 and the top drain electrode 162 to enhance an adhesive force between the interlayer dielectric 140 and the top drain electrode 162, and moreover, may prevent a lower surface of the top drain electrode 162 from being corroded. Therefore, an oxidation rate of the bottom drain electrode 161 may be lower than that of the top drain electrode 162. That is, a material of the bottom drain electrode 161 may be a material having a corrosion resistance which is stronger than that of a material of the top drain electrode 162. As described above, the bottom drain electrode 161 may be formed of an alloy (MoTi) of molybdenum (Mo) and titanium (Ti), but is not limited thereto.

The top drain electrode 162 may be formed on the top of the bottom drain electrode 161 and may be formed of copper (Cu) which is the same as that of the top source electrode 152, but is not limited thereto. In order to decrease a total resistance of the drain electrode 160, a thickness of the top drain electrode 162 may be set thicker than that of the bottom drain electrode 161.

The top drain electrode 162 and the top source electrode 152 may be formed of the same material to have the same thickness, and the bottom drain electrode 161 and the bottom source electrode 151 may be formed of the same material to have the same thickness. In this case, the drain electrode 160 and the source electrode may be simultaneously formed through the same process.

A structure of the TFT layer T is not limited to a structure shown in the drawing, and may be variously modified into a structure known to those skilled in the art. For example, in the drawing, the gate electrode 130 is illustrated as having a top gate structure where the gate electrode 130 is formed on the active layer 110, but is not limited thereto. In other aspects, the gate electrode 130 may be formed in a bottom gate structure where the gate electrode 130 is formed under the active layer 110.

The passivation layer 165 may be formed on the TFT layer T, and in more detail, may be formed on a top of each of the source electrode 150 and the drain electrode 160. The passivation layer 165 may protect the TFT layer T and may be formed of an inorganic insulating material, for example, silicon oxide (SiO$_x$), silicon nitride (SiN$_x$), or a multilayer thereof, but is not limited thereto.

The planarization layer 170 may be formed on the passivation layer 165. The planarization layer 170 may planarize an upper surface of the substrate 100 on which the TFT layer T is provided. The passivation layer 170 may be formed of an organic insulating material such as acryl resin, epoxy resin, phenolic resin, polyamide resin, polyimide resin, and/or the like, but is not limited thereto.

The planarization layer 170 may be provided to have a step height (or step coverage) in a certain area on the TFT layer T. In detail, the planarization layer 170 may include a plurality of areas, which are provided at different heights, and an area including an inclined surface between adjacent areas of the plurality of areas provided at different heights. That is, as described above, the planarization layer 170 may be provided to planarize the upper surface of the substrate 100 including the TFT layer T, and in an aspect of the present disclosure, the step height may be provided in the planarization layer 170 in the certain area, thereby enhancing an emission efficiency of light emitted from the organic light emitting layer 200. A more detailed feature of the present disclosure for enhancing emission efficiency through the above-described structure will be described below.

The planarization layer 170 may be an element for planarizing the upper surface of the substrate 100, and thus, the step height may be set to a value which is very small in comparison with a total height of the planarization layer 170 formed on the substrate 100.

The anode electrode 180 may be formed on the planarization layer 170. The passivation layer 165 and the planarization layer 170 may include a third contact hole CH3 which exposes the source electrode 150, and the source electrode 150 may be connected to the anode electrode 180 through the third contract hole CH3.

The anode electrode 180 may be formed on the planarization layer 170 to have a step height. In detail, as illustrated in FIG. 2, since the planarization layer 170 is provided to have a step height, the anode electrode 180 may be provided to have a uniform thickness in an area where the step height of the planarization layer 170 is provided, and thus, the anode electrode 180 may have a step height having a shape corresponding to the step height of the planarization layer 170. However, in the present aspect, a method of allowing the anode electrode 180 to have a step height is not limited thereto.

The anode electrode 180 may reflect the light, emitted from the organic light emitting layer 200, in an up direction. Therefore, the anode electrode 180 may include a material which has high reflectivity. The anode electrode 180 may include a bottom anode electrode 181, a center anode electrode 182, and a top anode electrode 183.

The bottom anode electrode 181 may be formed between the planarization layer 170 and the center anode electrode 182. The bottom anode electrode 181 may protect a lower surface of the center anode electrode 182, thereby preventing the lower surface of the center anode electrode 182 from being corroded. Therefore, an oxidation rate of the bottom anode electrode 181 may be lower than that of the center anode electrode 182. That is, a material of the bottom anode electrode 181 may be a material having a corrosion resistance which is stronger than that of a material of the center anode electrode 182. As described above, the bottom anode electrode 181 may act as an adhesion promotor or an anti-corrosion layer and may be formed of a transparent conductive material such as indium tin oxide (ITO) and/or the like, but is not limited thereto.

The center anode electrode 182 may be formed between the bottom anode electrode 181 and the top anode electrode 183. The center anode electrode 182 may be formed of a material which is better in reflectivity and lower in resistance than the bottom anode electrode 181 and the top anode electrode 183, and for example, may be formed of silver (Ag), but is not limited thereto. A thickness of the center anode electrode 182 having a relatively low resistance may be thicker than that of each of the bottom anode electrode 181 and the top anode electrode 183 which have a relative high resistance.

The top anode electrode 183 may be formed on an upper surface of the center anode electrode 182, thereby preventing the upper surface of the center anode electrode 182 from being corroded. Therefore, an oxidation rate of the top anode electrode 183 may be lower than that of the center anode electrode 182. That is, a material of the top anode electrode 183 may be a material having a corrosion resistance which is stronger than that of a material of the center anode electrode 182. As described above, the top anode electrode 183 may be formed of a transparent conductive material such as ITO and/or the like, but is not limited thereto.

Hereinabove, the anode electrode 180 is illustrated as being formed of a multilayer, but is not limited thereto. In other aspects, the anode electrode 180 may be formed of a single layer.

The bank 190 may be formed on the anode electrode 180.

The bank 190 may be formed on one side and the other side of the anode electrode 180 to expose an upper surface of the anode electrode 180. The bank 190 may be formed to expose the upper surface of the anode electrode 180, thereby securing an area on which an image is displayed. Also, since the bank 190 is formed on the one side and the other side of the anode electrode 180, a side surface of the anode electrode 180 vulnerable to corrosion is prevented from being exposed to the outside, thereby preventing the side surface of the anode electrode 180 from being corroded. In this case, the organic light emitting layer 200 and the cathode electrode 210 may be formed on the upper surface of the anode electrode 180, and thus, an exposed area of the anode electrode 180 where the organic light emitting layer 200 and the cathode electrode 210 are to be formed may correspond to an emissive area.

The bank 190 may be formed of an organic insulating material such as polyimide resin, acryl resin, benzocyclobutene (BCB), and/or the like, but is not limited thereto.

The organic light emitting layer 200 may be formed on the anode electrode 180. The organic light emitting layer 200 may include a hole injecting layer, a hole transporting layer, a light emitting layer, an electron transporting layer, and an electron injecting layer. A structure of the organic light emitting layer 200 may be modified into a structure known to those skilled in the art.

Particularly, the organic light emitting layer 200 may be formed on the anode electrode 180 to have a step height. In detail, since the anode electrode 180 is provided to have a step height, the organic light emitting layer 200 may be provided to have a uniform thickness in an area where a step height is provided in the anode electrode 180, and thus, the organic light emitting layer 200 may have a step height having a shape corresponding to the step height of the anode electrode 180. However, in the present aspect, a method of allowing the organic light emitting layer 200 to have a step height is not limited thereto.

The cathode electrode 210 may be formed on the organic light emitting layer 200. The cathode electrode 210 may be formed on a surface from which light is emitted, and thus, may be formed of a transparent conductive material.

Although not shown in the drawing, an encapsulation layer may be further formed on the cathode electrode 210, thereby preventing penetration of water. The encapsulation layer may use various materials known to those skilled in the art. Also, although not shown, a color filter may be further formed on the cathode electrode 210 in each of a plurality of pixels, and in this case, white light may be emitted from the organic light emitting layer 200.

Figure 3:
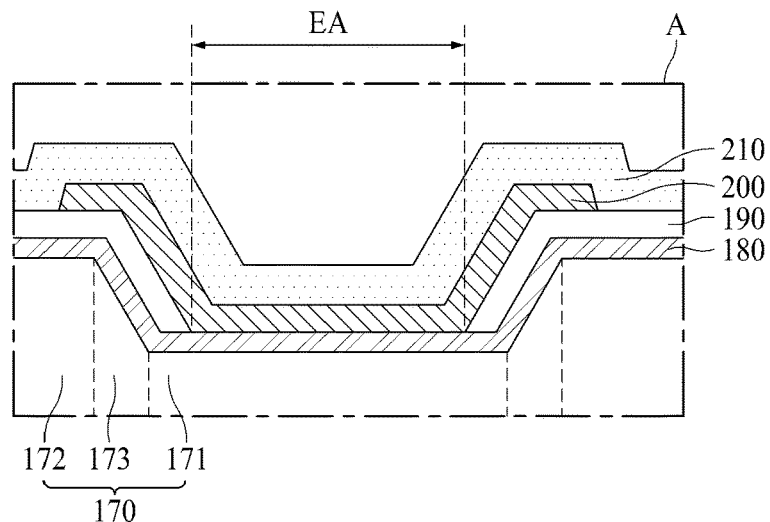
FIG. 3 is a schematic cross-sectional view of area A illustrated in FIG. 2, in an organic light emitting display device according to an aspect of the present disclosure.

FIG. 3 is a schematic cross-sectional view of area A illustrated in FIG. 2, in an organic light emitting display device according to an aspect of the present disclosure.

As illustrated in FIG. 3, the organic light emitting display device according to an aspect of the present disclosure may include a planarization layer 170, an anode electrode 180, a bank 190, an organic light emitting layer 200, and a cathode electrode 210 which are provided on a substrate.

The planarization layer 170, the anode electrode 180, the bank 190, the organic light emitting layer 200, and the cathode electrode 210 may be stacked on the substrate identically to the organic light emitting display device of FIG. 2. Hereinafter, therefore, like reference numerals refer to like elements, and only elements stacked in different structures will be described.

As described above, the planarization layer 170 may be provided to have a step height in a certain area on a TFT (not shown). In detail, the planarization layer 170 may include a first area 171, a second area 172 provided at a position higher than that of the first area 171, and a third area 173 including an inclined surface between the first area 171 and the second area 172.

The anode electrode 180 may be formed in the first area 171 and the third area 173 of the planarization layer 170 to have a step height on the planarization layer 170 and may extend to the second area 172. That is, in an aspect of the present disclosure, since the anode electrode 180 is provided in the third area 173 of the planarization layer 170 including the inclined surface, the anode electrode 180 can reflect light, which is emitted from the organic light emitting layer 200 and moves to a side surface of the organic light emitting layer 200, in an upward direction, thereby enhancing emission efficiency.

The bank 190 may be formed on one side and the other side of the anode electrode 180 to expose an upper surface of the anode electrode 180. The bank 190 may be formed on the upper surface of the anode electrode 180 in the third area 173 so that the bank 190 exposes the upper surface of the anode electrode 180 provided in the first area 171 of the planarization layer 170 to secure an area on which an image is displayed. If the anode electrode 180 is formed to extend to the second area 172 of the planarization layer 170, the bank 190 may be formed on the upper surface of the anode electrode 180 even in the second area 172.

The organic light emitting layer 200 may be formed on the anode electrode 180. The organic light emitting layer 200 may be formed on the upper surface of the anode electrode 180 in the first area 171 of the planarization layer 170 and may be formed on an upper surface of the bank 190 in the third area 173 of the planarization layer 170.

The cathode electrode 210 may be formed on the organic light emitting layer 200. The cathode electrode 210 may be formed on the entire upper surface of the organic light emitting layer 200 along with the anode electrode 180 so that the cathode electrode 210 repeatedly reflects light reflected by the organic light emitting layer 200 to achieve a micro-cavity effect. That is, in the present disclosure, the anode electrode 180 may be formed in the third area 173 of the planarization layer 170, and moreover, the organic light emitting layer 200 and the cathode electrode 210 may be formed together, thereby repeatedly reflecting light between the anode electrode 180 and the cathode electrode 210 to enhance emission efficiency by functioning as a micro-cavity.

As illustrated in FIG. 3, according to an aspect of the present disclosure, the third area 173 of the planarization layer 170 may be provided outside an emissive area EA. The emissive area EA may be an area where the organic light emitting layer 210 and the cathode electrode 220 are directly provided on the upper surface of the anode electrode 180, and may denote an area of the anode electrode 180 exposed by the bank 190. Therefore, in an aspect of the present disclosure, since the emissive area EA of the organic light emitting display device is maintained as-is and the third area 173 of the planarization layer 170 is provided outside the emissive area EA, emission efficiency is enhanced by reflecting light which is lost outside the emissive area EA.

As described above, in an aspect of the present disclosure, the planarization layer 170 may planarize an upper surface of the substrate on which the TFT is provided, and may have a step height in a certain area. Particularly, the third area 173 having an inclined surface may be provided between the first area 171 and the second area 172 having a step height, and the anode electrode 180 may be provided in the third area 173, thereby enhancing emission efficiency by reflecting light which moves to a side surface of the organic light emitting layer 200.

That is, the anode electrode 180 may be formed of a material having high reflectivity in order for the organic light emitting layer 200 to reflect light, and as illustrated in FIG. 3, the anode electrode 180 may be provided in the third area 173 of the planarization layer 170, whereby light moving along a boundary surface between the anode electrode 180 and the organic light emitting layer 200 in the first area 171 may be reflected in an upward direction by the anode electrode 180 in the third area 173. Also, the organic light emitting layer 200 and the cathode electrode 210 may be provided in the third area 173 together, thereby enhancing a micro-cavity effect and enhancing emission efficiency by 55% (30%+25%).

Figure 4:
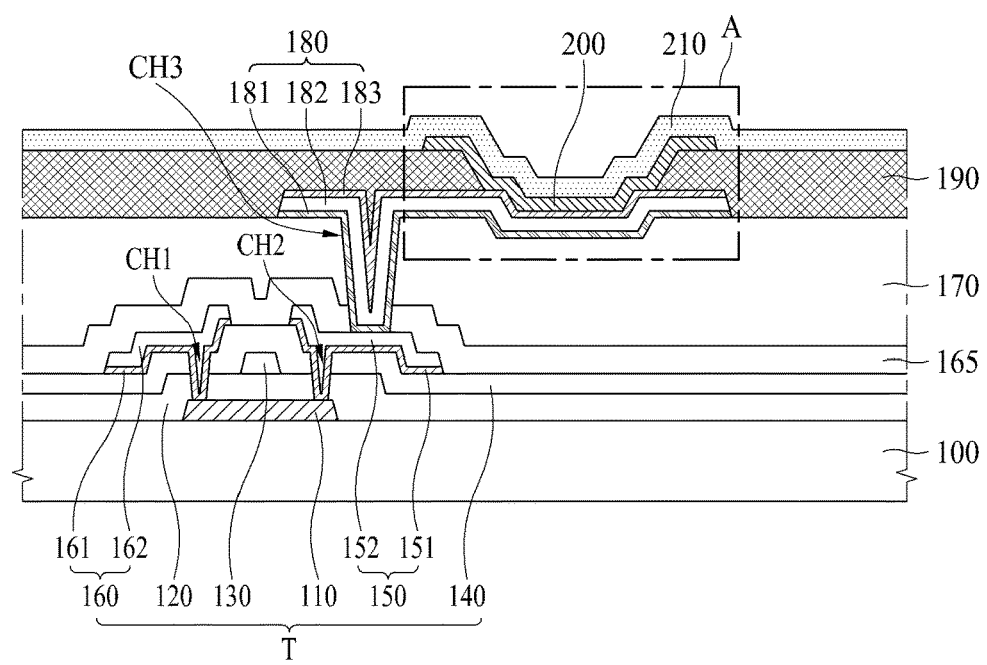
FIG. 4 is a cross-sectional view of an organic light emitting display device according to another aspect of the present disclosure.
Figure 5:
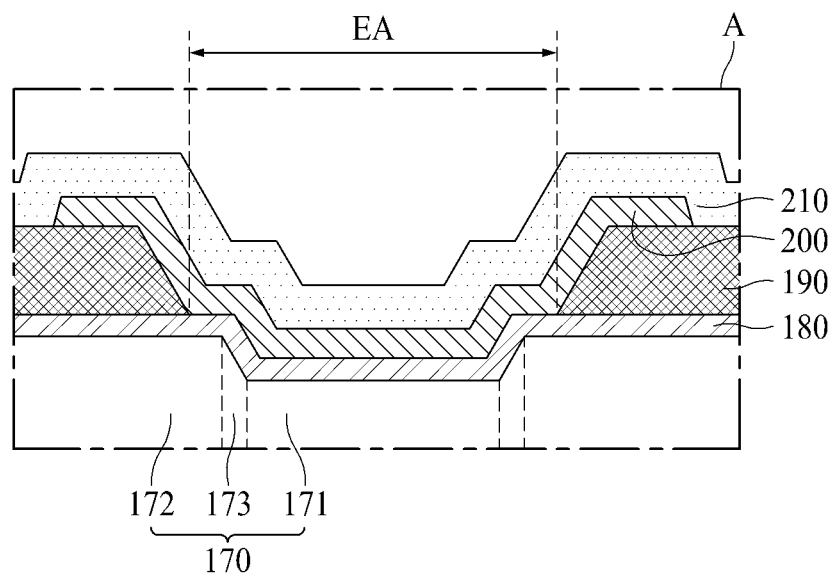
FIG. 5 is a schematic cross-sectional view of area A illustrated in FIG. 4, in an organic light emitting display device according to another aspect of the present disclosure.

FIG. 4 is a cross-sectional view of an organic light emitting display device according to another aspect of the present disclosure, and FIG. 5 is a schematic cross-sectional view of area A illustrated in FIG. 4, in an organic light emitting display device according to another aspect of the present disclosure. Except that arrangement and materials of a bank and some elements in the organic light emitting display device illustrated in FIG. 2 are changed, the organic light emitting display device illustrated in FIG. 5 is the same as the organic light emitting display device of FIG. 3 and the organic light emitting display device of FIG. 2. Hereinafter, therefore, like reference numerals refer to like elements, and only different elements will be described.

In the organic light emitting display device according to another aspect of the present disclosure, the bank 190 may be formed of a black bank including a material such as black resin and/or the like. That is, the organic light emitting display device may include a black bank so as to absorb external light reflected by a gate electrode 130, a source electrode 150, a drain electrode 160, and an anode electrode 180.

However, in a case where the bank 190 is provided on the upper surface of the anode electrode 180 in the third area 173 of the planarization layer 170 as in the organic light emitting display devices of FIGS. 2 and 3, if the bank 190 is the black bank, light which is emitted from the organic light emitting layer 200 and moves to a side surface of the organic light emitting layer 200 may be absorbed by the black bank before being reflected by the anode electrode 180 in the third area 173, and for this reason, it is unable to improve emission efficiency.

Therefore, in the organic light emitting display device according to another aspect of the present disclosure, if the bank 190 is formed of the black bank, the bank 190 may be provided in only the second area 172 without being provided in the third area 173 corresponding to an inclined area of the planarization layer 170, and thus, does not overlap the anode electrode 180, the organic light emitting layer 200, and the cathode electrode 210, thereby causing light to be reflected by the anode electrode 180 even in the third area 173.

In this case, as illustrated in FIG. 5, the third area 173 of the planarization layer 170 may be provided in the emissive area EA of the organic light emitting display device. Therefore, in the present aspect, the area of the anode electrode 180 exposed by the bank 190 is maintained as-is so as not to affect an area of a pixel area defined by the bank 190, and the planarization layer 170 may be formed to have a step height, thereby enhancing emission efficiency.

To provide a more detailed description on a structure of the organic light emitting display device according to another aspect of the present disclosure, the planarization layer 170 may be provided to have a step height in a certain area on a TFT (not shown). In detail, the planarization layer 170 may include a first area 171, a second area 172 provided at a position higher than that of the first area 171, and a third area 173 including an inclined surface between the first area 171 and the second area 172. Particularly, in another aspect of the present disclosure, the planarization layer 170 may be formed in order for the first area 171 and the third area 173 to be provided in the emissive area EA.

The anode electrode 180 may be provided in the first area 171 and the third area 173 of the planarization layer 170 to have a step height on the planarization layer 170 and may extend to the second area 172. That is, since the anode electrode 180 is provided to have a step height, the anode electrode 180 may be provided to have a uniform thickness in an area where a step height is provided in the planarization layer 170, and thus, the anode electrode 180 may have a step height having a shape corresponding to the step height of the planarization layer 170. However, in the present aspect, a method of allowing the anode electrode 180 to have a step height is not limited thereto.

In another aspect of the present disclosure, the bank 190 may be formed of the black bank and may be formed on one side and the other side of the anode electrode 180 to expose a portion of an upper surface of the anode electrode 180. The bank 190 may be formed on the upper surface of the anode electrode 180 in only the second area 172 so that the bank 190 exposes a portion of the upper surface of the anode electrode 180 provided in the first area 171 and the third area 173 of the planarization layer 170 to secure an area on which an image is displayed. That is, since the bank 190 is not provided in the third area 173, light reflected or emitted from the third area 173 is prevented from being absorbed by the bank 190.

The organic light emitting layer 200 may be formed on the anode electrode 180. The organic light emitting layer 200 may be formed on the upper surface of the anode electrode 180 in the first area 171 and the third area 173 of the planarization layer 170 and may be formed on an upper surface of the bank 190 in the second area 172 of the planarization layer 170.

The cathode electrode 210 may be formed on the organic light emitting layer 200. The cathode electrode 210 may be formed on the entire upper surface of the organic light emitting layer 200 along with the anode electrode 180 so that the cathode electrode 210 repeatedly reflects light reflected by the organic light emitting layer 200 to achieve a micro-cavity effect.

As illustrated in FIG. 5, according to another aspect of the present disclosure, the third area 173 of the planarization layer 170 may be provided in an emissive area EA. The emissive area EA may be an area where the organic light emitting layer 210 and the cathode electrode 220 are directly provided on the upper surface of the anode electrode 180, and may denote an area of the anode electrode 180 exposed by the bank 190. Therefore, in another aspect of the present disclosure, since the emissive area EA of the organic light emitting display device is maintained as-is and the third area 173 of the planarization layer 170 is provided in the emissive area EA, emission efficiency is enhanced by reflecting light which moves to a side surface of the organic light emitting layer 210.

As described above, in another aspect of the present disclosure, the planarization layer 170 may planarize an upper surface of the substrate on which the TFT is provided, and may have a step height in a certain area. Particularly, the third area 173 having an inclined surface may be provided between the first area 171 and the second area 172 having a step height, and the anode electrode 180 may be provided in the third area 173, thereby enhancing emission efficiency by reflecting the light which moves to the side surface of the organic light emitting layer 200.

Moreover, if the bank 190 is formed of a black bank, a reflectivity of external light is lowered, but the light which moves to the side surface of the organic light emitting layer 200 may be absorbed by the bank 190, causing a reduction in emission efficiency. Therefore, the bank 190 may be provided in only the second area 172 without being provided in the third area 173. Accordingly, according to another aspect of the present disclosure, light may be emitted through the organic light emitting layer 200 from the first area 171 and the third area 173, and moreover, light which moves to the side surface of the organic light emitting layer 200 through the anode electrode 180 and is lost may be reflected from the third area 173, thereby enhancing a micro-cavity effect and enhancing emission efficiency by 55% (30%+25%).

FIGS. 6A to 6G are process cross-sectional views illustrating a method of manufacturing an organic light emitting display device according to an aspect of the present disclosure and relate to a method of manufacturing the organic light emitting display device of FIG. 2.

Figure 6A:
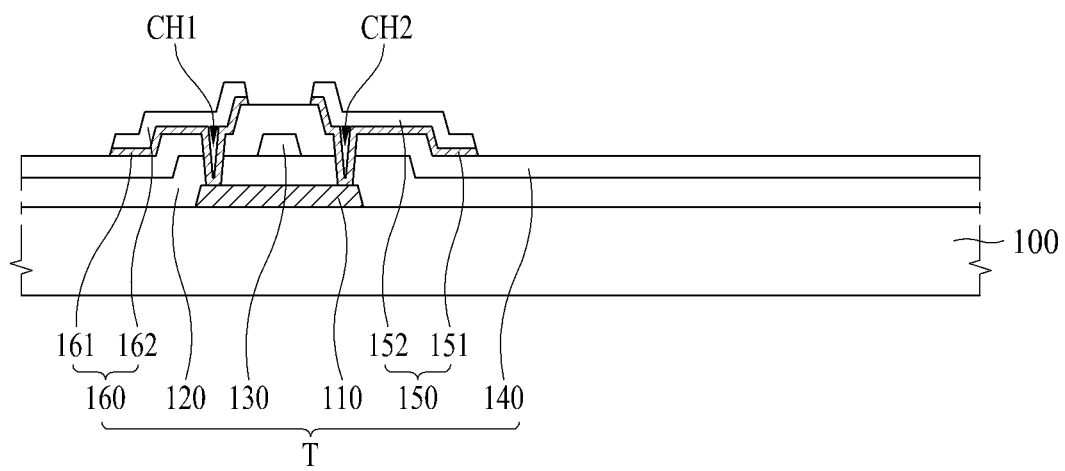
FIGS. 6A to 6G are process cross-sectional views illustrating a method of manufacturing an organic light emitting display device according to an aspect of the present disclosure.

First, as seen in FIG. 6A, an active layer 110, a gate insulation layer 120, a gate electrode 130, an interlayer dielectric 140, a source electrode 150, and a drain electrode 160 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, a first contact hole CH1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 may be formed.

The source electrode 150 may include a bottom source electrode 151 and a top source electrode 152, and the drain electrode 160 may include a bottom drain electrode 161 and a top drain electrode 162. The source electrode 150 and the drain electrode 160 may be simultaneously formed of the same material through the same patterning process.

Figure 6B:
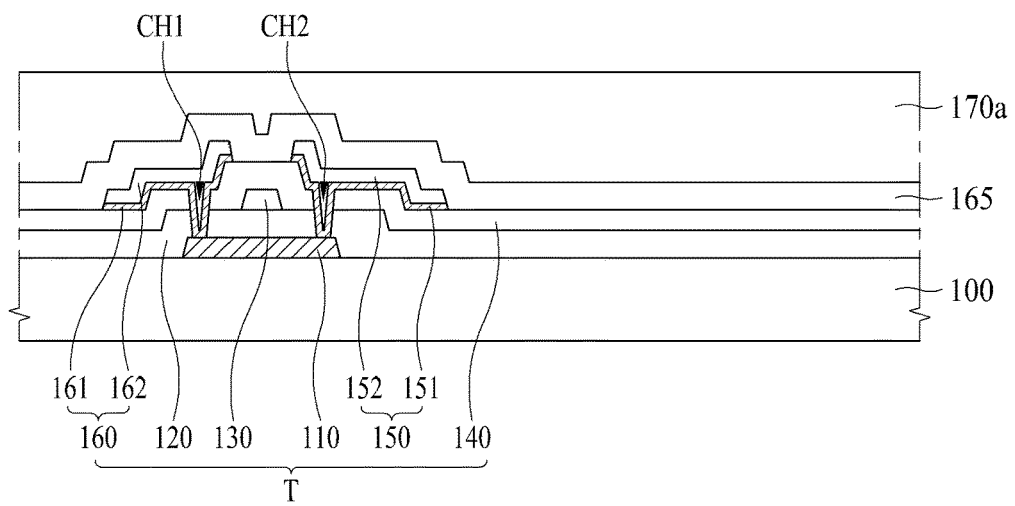

Subsequently, as seen in FIG. 6B, a passivation layer 165 may be formed on the source electrode 150 and the drain electrode 160, and a first planarization layer 170a may be formed on the passivation layer 165.

Figure 6C:
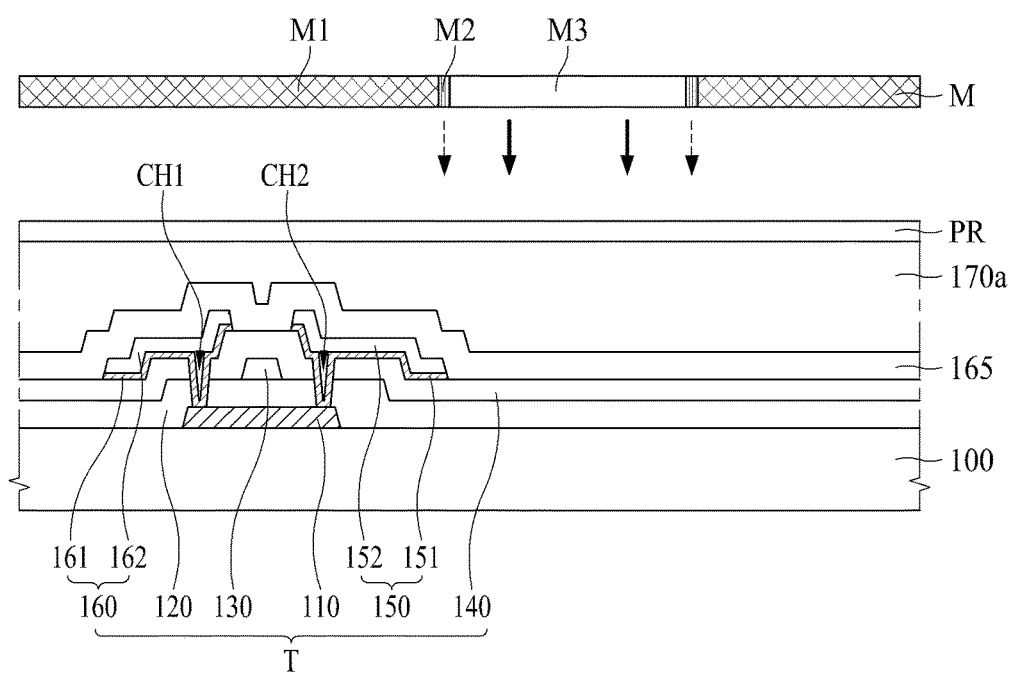

Subsequently, as seen in FIG. 6C, a planarization material layer PR may be formed on the first planarization layer 170a, and a mask pattern M may be aligned on the planarization material layer PR. Particularly, the planarization material layer PR according to an aspect of the present disclosure may be formed of a positive type photosensitive material.

That is, since the planarization material layer PR is formed of the positive type photosensitive material, an area where transmission of light is blocked in an exposure process may remain after a development process, and an area through which light is transmitted in the exposure process may be removed after the development process.

Moreover, the mask pattern M may include a light blocking pattern M1 where transmission of all light is blocked in the exposure process, a semi-transmissive pattern M2 through which some of light is non-uniformly transmitted in the exposure process, and a transmissive pattern M3 through which all of light is transmitted in the exposure process. Particularly, the semi-transmissive pattern M2 may include a pattern where the amount of transmitted light is changed depending on positions. A characteristic of the semi-transmissive pattern M2 will be described below.

In this manner, after the mask pattern M is aligned, an exposure process and a development process may be performed on the planarization material layer PR by using the mask pattern M as a mask.

Since the mask pattern M includes the light blocking pattern M1, the semi-transmissive pattern M2, and the transmissive pattern M3, light may not be irradiated onto the planarization material layer PR disposed under the light blocking pattern M1, only some of the light may be irradiated onto the planarization material layer PR disposed under the semi-transmissive pattern M2, and all of the light may be irradiated onto the planarization material layer PR disposed under the transmissive pattern M3.

Figure 6D:
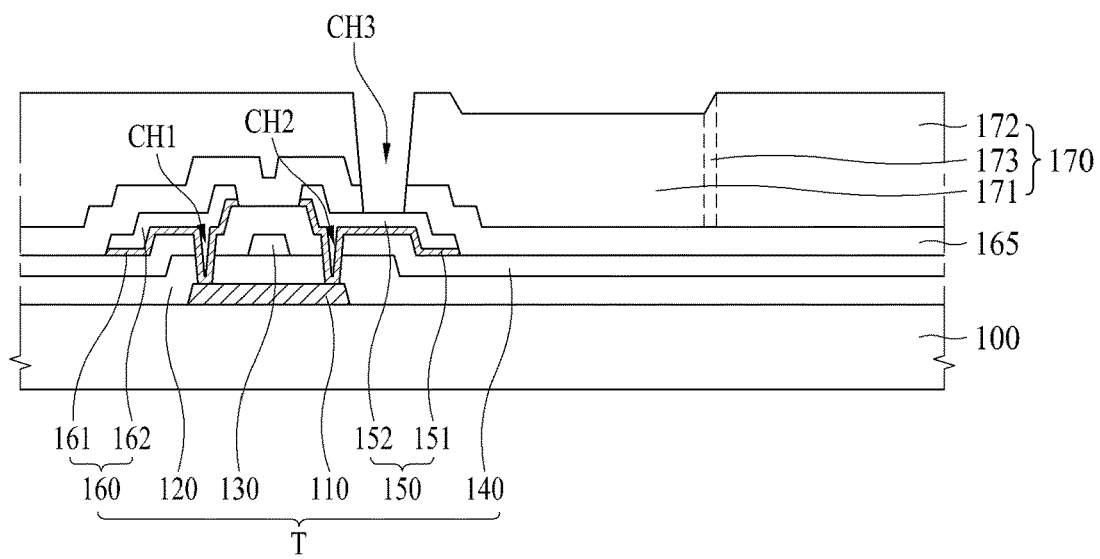

Subsequently, as seen in FIG. 6D, a planarization layer 170 which has a step height and includes the first planarization layer 170a and the planarization material layer PR for which the exposure process and the development process have been performed may be formed.

As a result, the planarization layer 170 may include a first area 171, a second area 172 provided at a position higher than that of the first area 171, and a third area 173 including an inclined surface between the first area 171 and the second area 172, which are provided at different heights to have a step height.

That is, as described above, since the planarization material layer PR is formed of the positive type photosensitive material, a whole portion of the planarization material layer PR where all of the light is blocked may remain in correspondence with the light blocking pattern M1, only a portion of the planarization material layer PR onto which only some of the light is irradiated may remain in correspondence with the semi-transmissive pattern M2, and the whole portion of the planarization material layer PR onto which all of the light is irradiated may be removed in correspondence with the transmissive pattern M3.

Therefore, the second area 172 of the planarization layer 170 may be formed in an area, corresponding to the light blocking pattern M1, by the first planarization layer 170a and the planarization material layer PR which remains as-is. Also, the third area 173 of the planarization layer 170 may be formed in an area, corresponding to the semi-transmissive pattern M2, by the first planarization layer 170a and the planarization material layer PR of which only a portion remains. Also, the first area 171 of the planarization layer 170 may be formed in an area, corresponding to the transmissive pattern M3, by the first planarization layer 170a.

Particularly, since the third area 173 should include an inclined surface in order for a height thereof to be lowered in a direction from the second area 172 to the first area 171, the semi-transmissive pattern M2 may be formed of a pattern which increases the amount of transmitted light in a direction from an area adjacent to the light blocking pattern M1 to an area adjacent to the transmissive pattern M3.

At this time, as illustrated in FIG. 6D, in a process of forming the planarization layer 170 having the step height, the passivation layer 165 and the planarization layer 170 may include a third contact hole CH3, and thus, the source electrode 150 may be exposed to the outside through the third contact hole CH3.

Figure 6E:
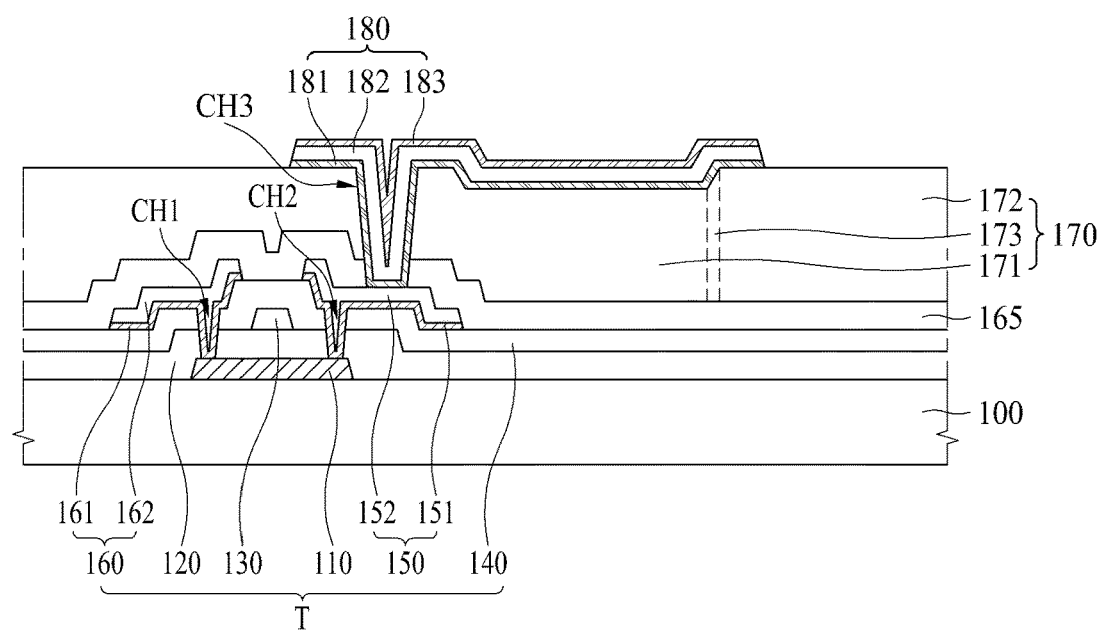

Subsequently, as seen in FIG. 6E, an anode electrode 180 may be formed on the planarization layer 170. The anode electrode 180 may be connected to the source electrode 150 through the third contact hole CH3. The anode electrode 180 may be provided in the first area 171 and the third area 173 of the planarization layer 170 and may extend to the second area 172.

The anode electrode 180 may include a bottom anode electrode 181, a center anode electrode 182, and a top anode electrode 183.

Figure 6F:
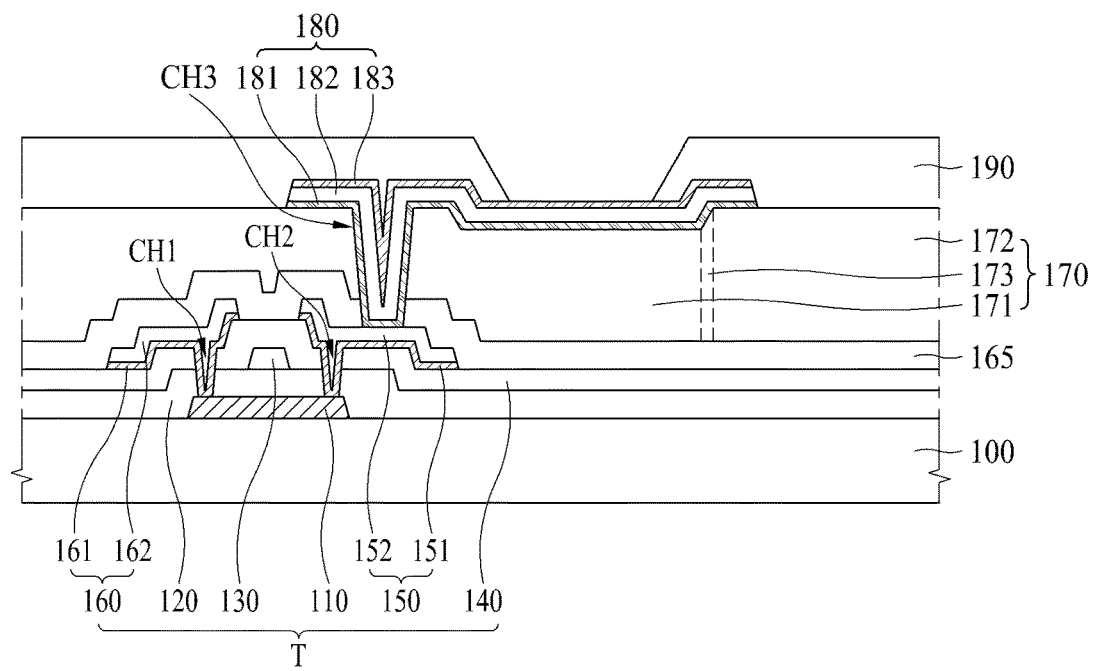

Subsequently, as seen in FIG. 6F, a bank 190 may be formed on the anode electrode 180. The bank 190 may be formed on one side and the other side of the anode electrode 180 to expose an upper surface of the anode electrode 180. The bank 190 may be formed to expose the upper surface of the anode electrode 180 provided in the first area 171 of the planarization layer 170, thereby securing an area on which an image is displayed.

Figure 6G:
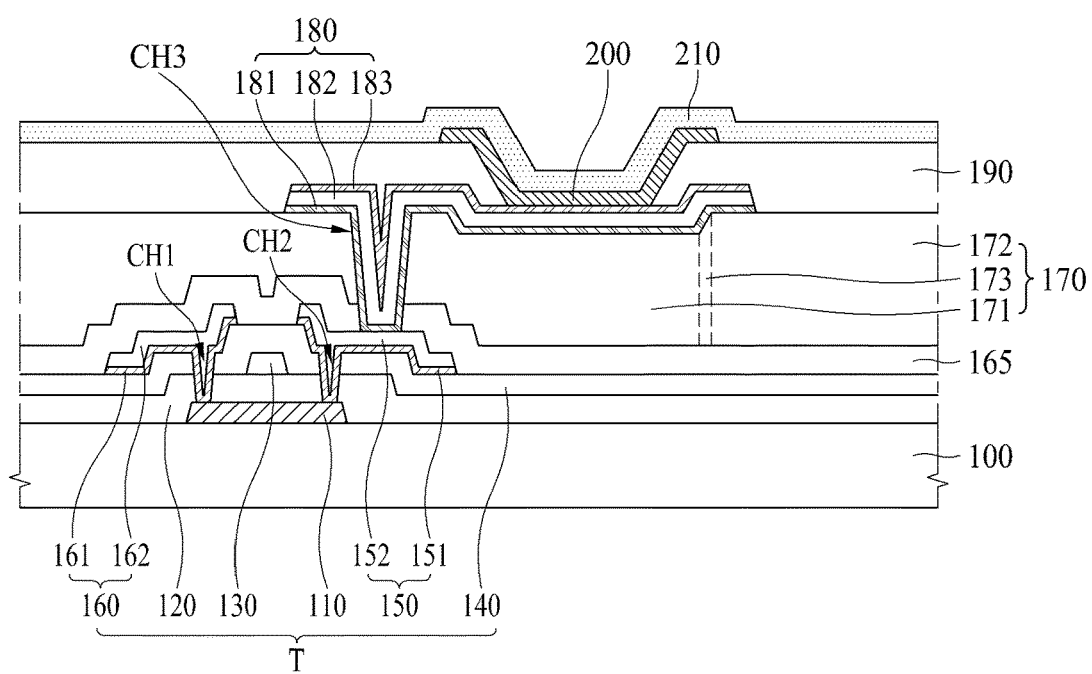

Subsequently, as seen in FIG. 6G, an organic light emitting layer 200 and a cathode electrode 210 may be sequentially formed on the anode electrode 180. The organic light emitting layer 200 may be formed in the first area 171 and the third area 173 of the planarization layer 170, and the cathode electrode 210 may be formed on a whole upper surface of the organic light emitting layer 200 along with the anode electrode 180 so that the cathode electrode 210 repeatedly reflects light reflected by the organic light emitting layer 200 to achieve a micro-cavity effect.

As described above, according to an aspect of the present disclosure, the third area 173 including the inclined surface may be formed in the planarization layer 170, and the anode electrode 180, the organic light emitting layer 200, and the cathode electrode 210 may be formed to overlap each other in the third area 173, thereby enhancing emission efficiency by reflecting light which moves to a side surface of the organic light emitting layer 200.

Hereinabove, an example where each of the first planarization layer 170a and the planarization material layer PR is formed through a separate process and thus the planarization layer 170 is formed to have the step height has been described, but the present aspect is not limited thereto. In other aspects, the planarization layer 170 having the step height may be formed through a single process. This will be described below.

FIGS. 7A to 7F are process cross-sectional views illustrating another method of manufacturing an organic light emitting display device according to an aspect of the present disclosure and relate to a method of manufacturing the organic light emitting display device of FIG. 2. Except for a process of patterning a planarization layer 170, a method of manufacturing the organic light emitting display device illustrated in FIGS. 7A to 7F is the same as the method of manufacturing the organic light emitting display device illustrated in FIGS. 6A to 6G. Therefore, like reference numerals refer to like elements, and repetitive descriptions of a material and a structure of each element are omitted.

Figure 7A:
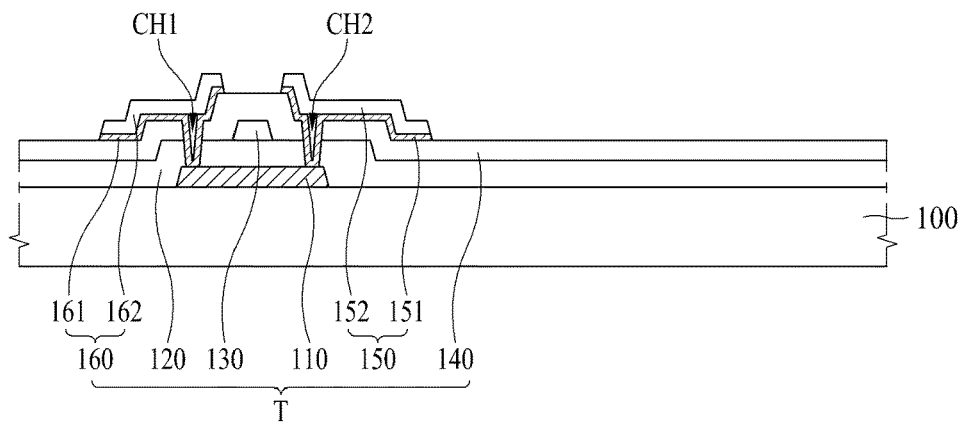
FIGS. 7A to 7F are process cross-sectional views illustrating another method of manufacturing an organic light emitting display device according to an aspect of the present disclosure.

First, as seen in FIG. 7A, an active layer 110, a gate insulation layer 120, a gate electrode 130, an interlayer dielectric 140, a source electrode 150, and a drain electrode 160 may be sequentially formed on a substrate 100.

Figure 7B:
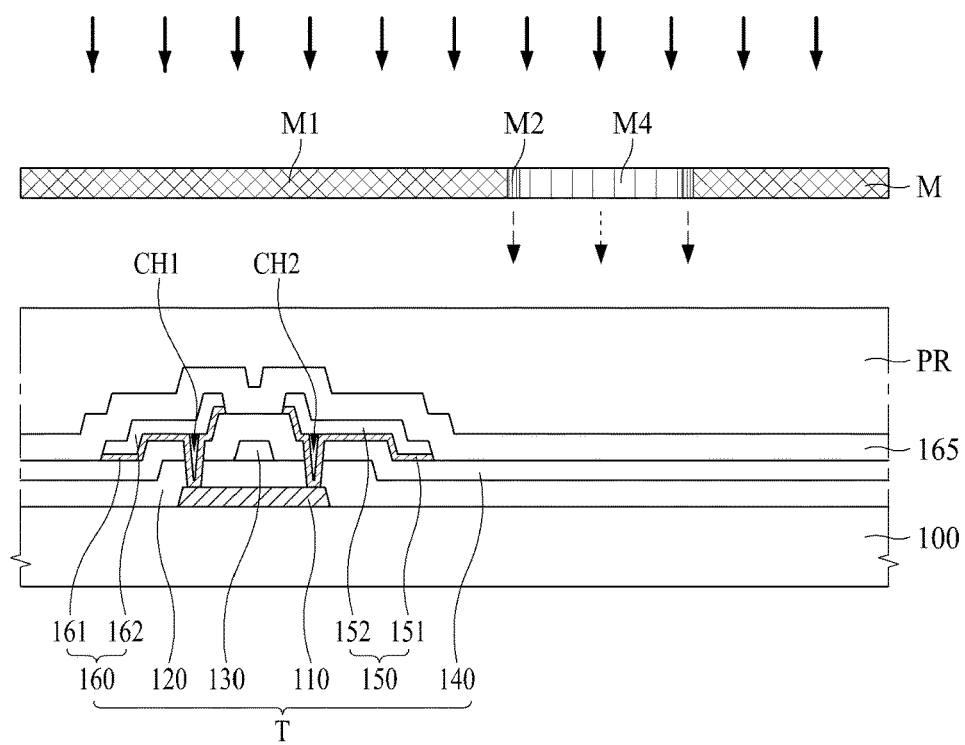

Subsequently, as seen in FIG. 7B, a passivation layer 165 may be formed on the source electrode 150 and the drain electrode 160, a planarization material layer PR may be formed on the passivation layer 165, and a mask pattern M may be aligned on the planarization material layer PR. Particularly, the planarization material layer PR according to an aspect of the present disclosure may be formed of a positive type photosensitive material.

That is, since the planarization material layer PR is formed of the positive type photosensitive material, an area where transmission of light is blocked in an exposure process may remain after a development process, and an area onto which light is irradiated in the exposure process may be removed after the development process.

Moreover, the mask pattern M may include a light blocking pattern M1 where transmission of all light is blocked in the exposure process, a first semi-transmissive pattern M2 through which some of the light is non-uniformly transmitted in the exposure process, and a second semi-transmissive pattern M4 through which some of the light is uniformly transmitted in the exposure process. That is, the first semi-transmissive pattern M2 may include a pattern where the amount of transmitted light is changed depending on positions, and the second semi-transmissive pattern M4 may include a pattern which enables transmitted light to be uniform irrespective of positions.

In this manner, after the mask pattern M is aligned, an exposure process and a development process may be performed on the planarization material layer PR by using the mask pattern M as a mask.

Since the mask pattern M includes the light blocking pattern M1, the first semi-transmissive pattern M2, and the second semi-transmissive pattern M4, light may not be irradiated onto the planarization material layer PR disposed under the light blocking pattern M1, only some of the light may be non-uniformly irradiated onto the planarization material layer PR disposed under the first semi-transmissive pattern M2, and the light may be uniformly irradiated onto the planarization material layer PR disposed under the second semi-transmissive pattern M4.

Figure 7C:
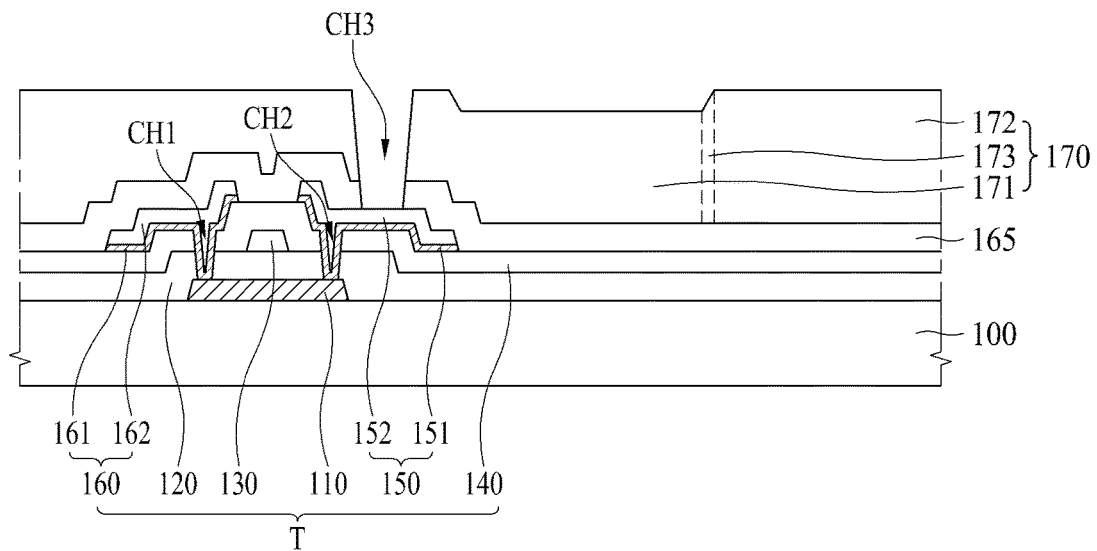

Subsequently, as seen in FIG. 7C, a planarization layer 170 having a step height may be formed by using the planarization material layer PR for which the exposure process and the development process have been performed.

In detail, when the planarization material layer PR is developed by irradiating light onto the planarization material layer PR through the mask pattern M, as illustrated in FIG. 7C, a planarization material pattern having a step height may be formed, and the planarization layer 170 may be formed by using the planarization material pattern which remains.

As a result, the planarization layer 170 may include a first area 171, a second area 172 provided at a position higher than that of the first area 171, and a third area 173 including an inclined surface between the first area 171 and the second area 172, which are provided at different heights to have a step height.

That is, as described above, since the planarization material layer PR is formed of the positive type photosensitive material, a whole portion of the planarization material layer PR where all of the light is blocked may remain in correspondence with the light blocking pattern M1, only a portion of the planarization material layer PR onto which only some of the light is non-uniformly irradiated may remain with an inclined surface in correspondence with the first semi-transmissive pattern M2, and only a portion of the planarization material layer PR onto which only some of the light is uniformly irradiated may remain with a uniform height in correspondence with the second semi-transmissive pattern M4.

Therefore, the second area 172 of the planarization layer 170 may be formed in an area, corresponding to the light blocking pattern M1, by the planarization material layer PR which remains as-is. Also, the third area 173 of the planarization layer 170 may be formed in an area, corresponding to the first semi-transmissive pattern M2, by the planarization material layer PR of which only a portion remains with an inclined surface. Also, the first area 171 of the planarization layer 170 may be formed in an area, corresponding to the second semi-transmissive pattern M4, by the planarization material layer PR of which only a portion remains with a uniform height.

Particularly, since the third area 173 should include an inclined surface in order for a height thereof to be lowered in a direction from the second area 172 to the first area 171, the first semi-transmissive pattern M2 may be formed of a pattern which increases the amount of transmitted light in a direction from an area adjacent to the light blocking pattern M1 to an area adjacent to the second semi-transmissive pattern M4.

At this time, as illustrated in FIG. 7C, in a process of forming the planarization layer 170 having the step height, the passivation layer 165 and the planarization layer 170 may include a third contact hole CH3, and thus, the source electrode 150 may be exposed to the outside through the third contact hole CH3.

Figure 7D:
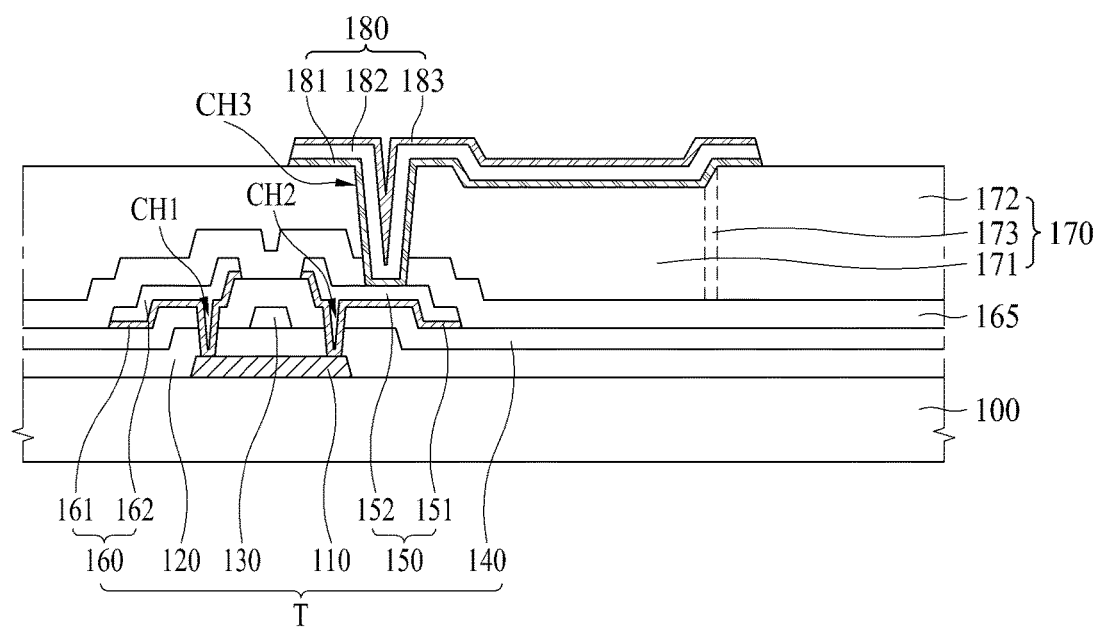

Subsequently, as seen in FIG. 7D, an anode electrode 180 may be formed on the planarization layer 170. The anode electrode 180 may be connected to the source electrode 150 through the third contact hole CH3. The anode electrode 180 may be provided in the first area 171 and the third area 173 of the planarization layer 170 and may extend to the second area 172.

The anode electrode 180 may include a bottom anode electrode 181, a center anode electrode 182, and a top anode electrode 183.

Figure 7E:
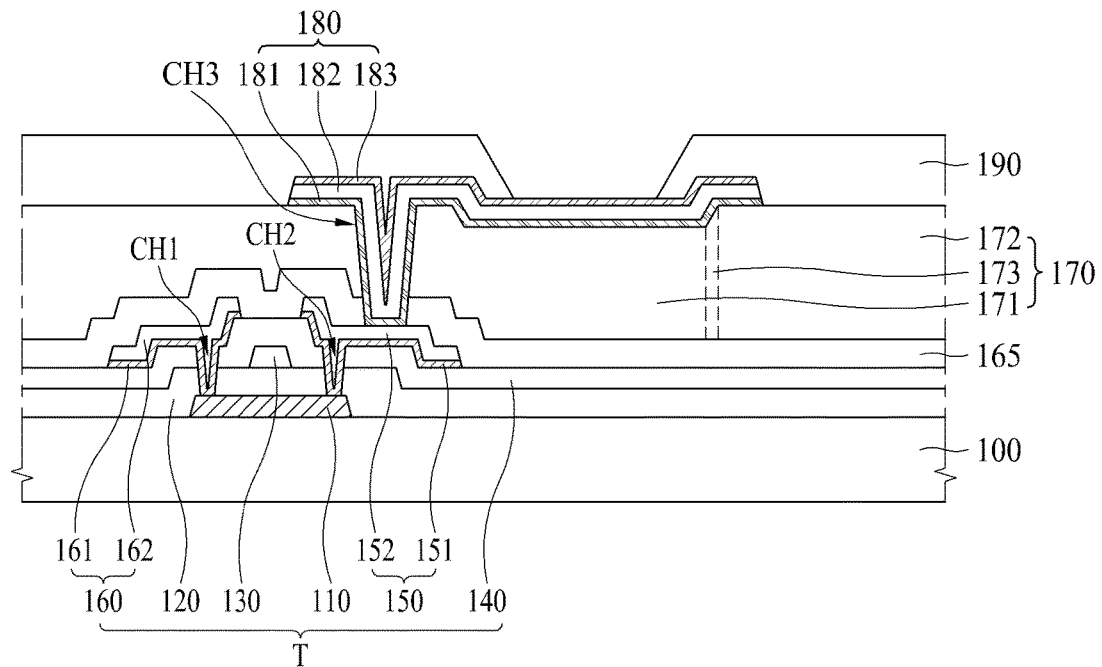

Subsequently, as seen in FIG. 7E, a bank 190 may be formed on the anode electrode 180. The bank 190 may be formed on one side and the other side of the anode electrode 180 to expose an upper surface of the anode electrode 180. The bank 190 may be formed in the second area 172 and the third area 173 to expose the upper surface of the anode electrode 180 provided in the first area 171 of the planarization layer 170, thereby securing an area on which an image is displayed. Accordingly, since the third area 173 of the planarization layer 170 is provided under the bank 190, an emissive area is maintained as-is, and emission efficiency is enhanced due to reflection of light by the anode electrode 180 under the bank 190.

Figure 7F:
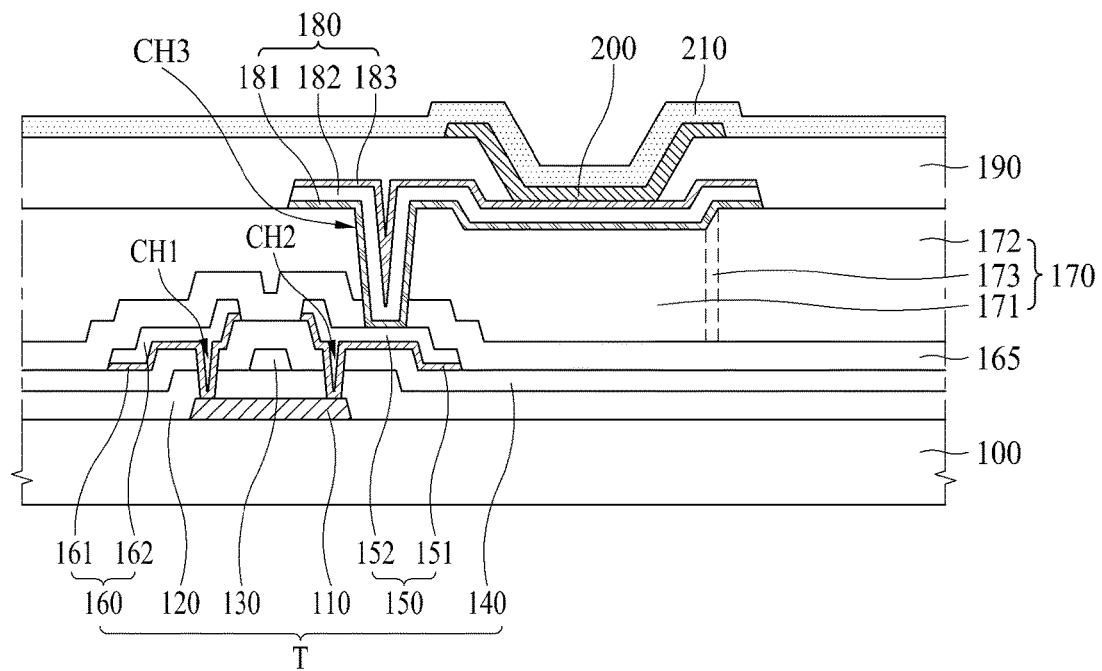

Subsequently, as seen in FIG. 7F, an organic light emitting layer 200 and a cathode electrode 210 may be sequentially formed on the anode electrode 180. The organic light emitting layer 200 may be formed in the first area 171 and the third area 173 of the planarization layer 170, and the cathode electrode 210 may be formed on a whole upper surface of the organic light emitting layer 200 along with the anode electrode 180 so that the cathode electrode 210 repeatedly reflects light reflected by the organic light emitting layer 200 to achieve a micro-cavity effect.

As described above, according to an aspect of the present disclosure, the third area 173 including the inclined surface may be formed in the planarization layer 170, and the anode electrode 180, the organic light emitting layer 200, and the cathode electrode 210 may be formed to overlap each other in the third area 173, thereby enhancing emission efficiency by reflecting light which moves to a side surface of the organic light emitting layer 200.

Moreover, in comparison with FIGS. 6A to 6G, the other method of manufacturing the organic light emitting display device according to an aspect of the present disclosure may pattern the planarization layer 170 having the step height through a one-time mask process as in FIG. 7B, thereby enhancing emission efficiency without an additional process.

FIGS. 8A to 8F are process cross-sectional views illustrating a method of manufacturing an organic light emitting display device according to another aspect of the present disclosure and relate to a method of manufacturing the organic light emitting display device of FIG. 4. Therefore, like reference numerals refer to like elements, and repetitive descriptions of a material and a structure of each element are omitted.

Figure 8A:
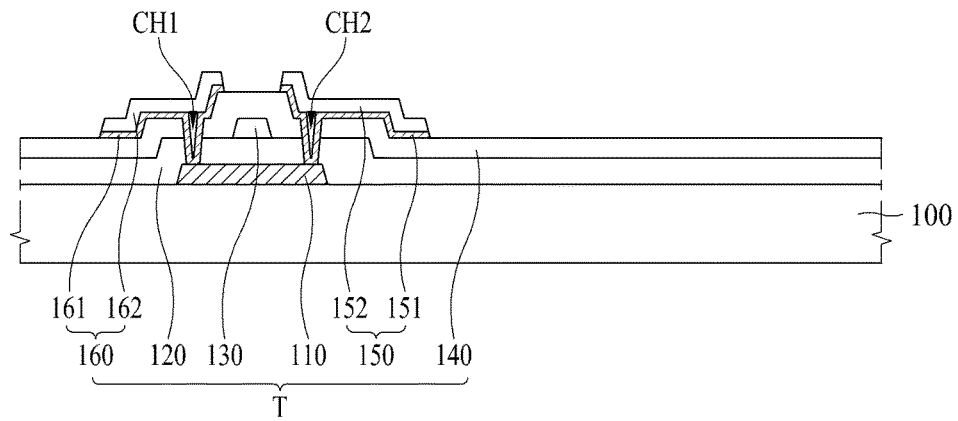
FIGS. 8A to 8F are process cross-sectional views illustrating a method of manufacturing an organic light emitting display device according to another aspect of the present disclosure.

First, as seen in FIG. 8A, an active layer 110, a gate insulation layer 120, a gate electrode 130, an interlayer dielectric 140, a source electrode 150, and a drain electrode 160 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, a first contact hole CH1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 may be formed.

The source electrode 150 may include a bottom source electrode 151 and a top source electrode 152, and the drain electrode 160 may include a bottom drain electrode 161 and a top drain electrode 162. The source electrode 150 and the drain electrode 160 may be simultaneously formed of the same material through the same patterning process.

Figure 8B:
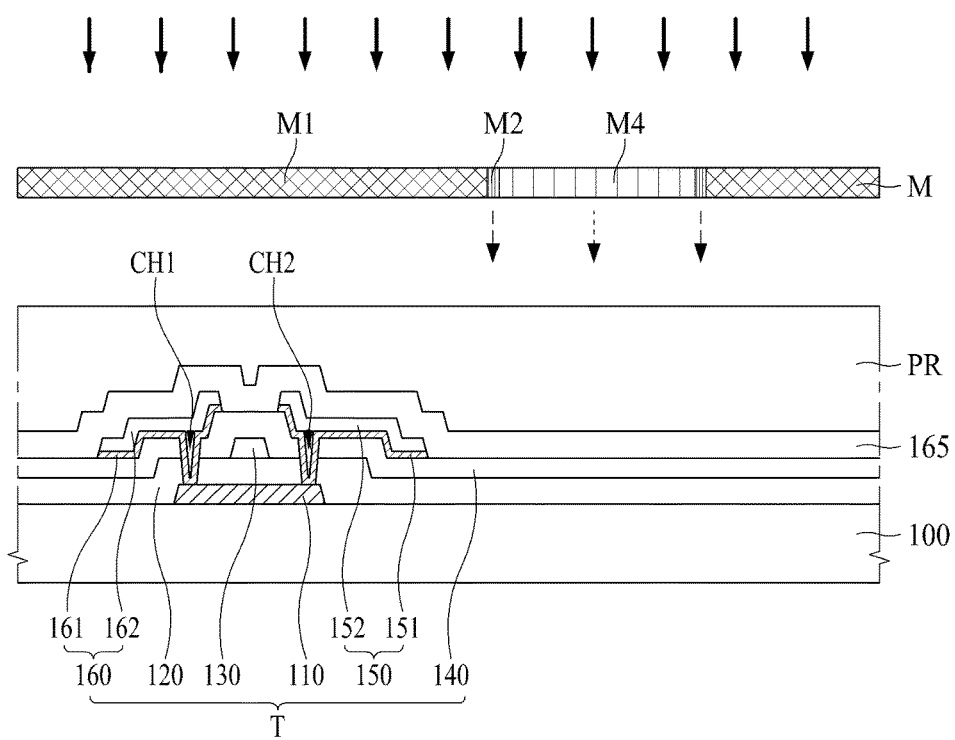

Subsequently, as seen in FIG. 8B, a passivation layer 165 may be formed on the source electrode 150 and the drain electrode 160, a planarization material layer PR may be formed on the passivation layer 165, and a mask pattern M may be aligned on the planarization material layer PR. Particularly, the planarization material layer PR according to an aspect of the present disclosure may be formed of a positive type photosensitive material.

That is, since the planarization material layer PR is formed of the positive type photosensitive material, an area where transmission of light is blocked in an exposure process may remain after a development process, and an area onto which light is irradiated in the exposure process may be removed after the development process.

Moreover, the mask pattern M may include a light blocking pattern M1 where transmission of all light is blocked in the exposure process, a first semi-transmissive pattern M2 through which some of the light is non-uniformly transmitted in the exposure process, and a second semi-transmissive pattern M4 through which some of the light is uniformly transmitted in the exposure process. That is, the first semi-transmissive pattern M2 may include a pattern where the amount of transmitted light is changed depending on positions, and the second semi-transmissive pattern M4 may include a pattern which enables transmitted light to be uniform irrespective of positions.

In this manner, after the mask pattern M is aligned, an exposure process and a development process may be performed on the planarization material layer PR by using the mask pattern M as a mask.

Since the mask pattern M includes the light blocking pattern M1, the first semi-transmissive pattern M2, and the second semi-transmissive pattern M4, light may not be irradiated onto the planarization material layer PR disposed under the light blocking pattern M1, only some of the light may be non-uniformly irradiated onto the planarization material layer PR disposed under the first semi-transmissive pattern M2, and the light may be uniformly irradiated onto the planarization material layer PR disposed under the second semi-transmissive pattern M4.

Figure 8C:
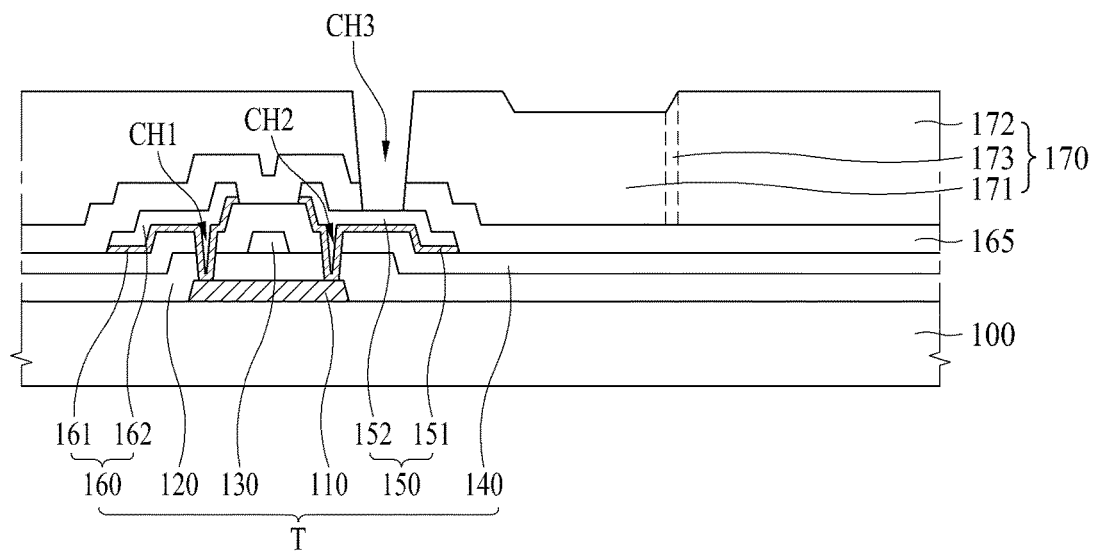

Subsequently, as seen in FIG. 8C, a planarization layer 170 having a step height may be formed by using the planarization material layer PR for which the exposure process and the development process have been performed.

As a result, the planarization layer 170 may include a first area 171, a second area 172 provided at a position higher than that of the first area 171, and a third area 173 including an inclined surface between the first area 171 and the second area 172, which are provided at different heights to have a step height.

That is, as described above, since the planarization material layer PR is formed of the positive type photosensitive material, a whole portion of the planarization material layer PR where all of the light is blocked may remain in correspondence with the light blocking pattern M1, only a portion of the planarization material layer PR onto which only some of the light is non-uniformly irradiated may remain with an inclined surface in correspondence with the first semi-transmissive pattern M2, and only a portion of the planarization material layer PR onto which only some of the light is uniformly irradiated may remain with a uniform height in correspondence with the second semi-transmissive pattern M4.

Therefore, the second area 172 of the planarization layer 170 may be formed in an area, corresponding to the light blocking pattern M1, by the planarization material layer PR which remains as-is. Also, the third area 173 of the planarization layer 170 may be formed in an area, corresponding to the first semi-transmissive pattern M2, by the planarization material layer PR of which only a portion remains with an inclined surface. Also, the first area 171 of the planarization layer 170 may be formed in an area, corresponding to the second semi-transmissive pattern M4, by the planarization material layer PR of which only a portion remains with a uniform height.

Particularly, since the third area 173 should include an inclined surface in order for a height thereof to be lowered in a direction from the second area 172 to the first area 171, the first semi-transmissive pattern M2 may be formed of a pattern which increases the amount of transmitted light in a direction from an area adjacent to the light blocking pattern M1 to an area adjacent to the second semi-transmissive pattern M4.

At this time, as illustrated in FIG. 8C, in a process of forming the planarization layer 170 having the step height, the passivation layer 165 and the planarization layer 170 may include a third contact hole CH3, and thus, the source electrode 150 may be exposed to the outside through the third contact hole CH3.

Figure 8D:
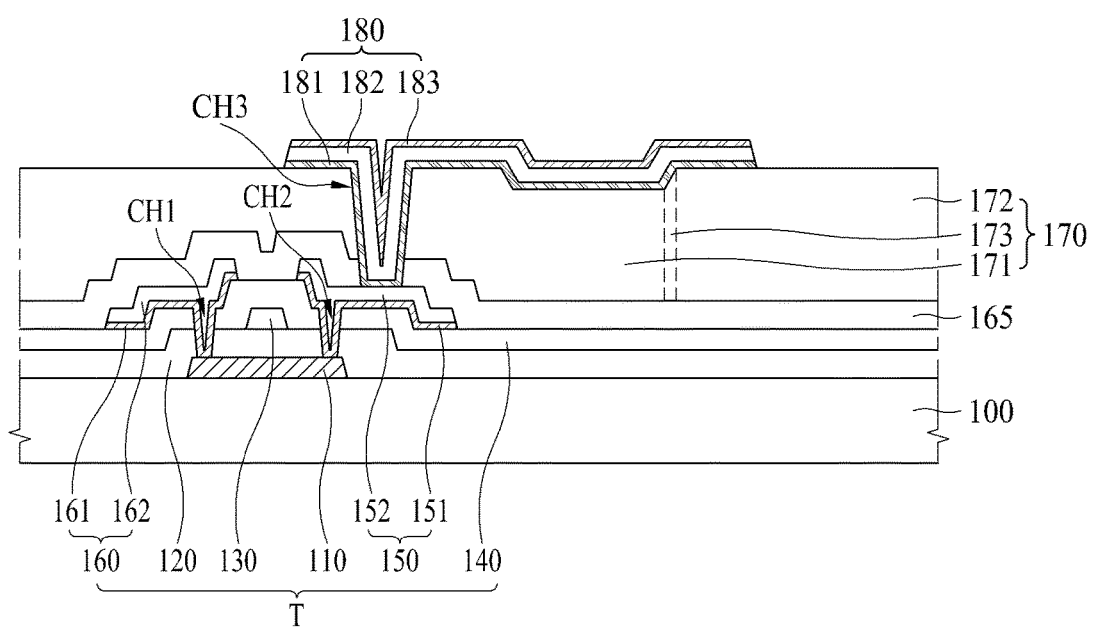

Subsequently, as seen in FIG. 8D, an anode electrode 180 may be formed on the planarization layer 170. The anode electrode 180 may be connected to the source electrode 150 through the third contact hole CH3. The anode electrode 180 may be provided in the first area 171 and the third area 173 of the planarization layer 170 and may extend to the second area 172.

The anode electrode 180 may include a bottom anode electrode 181, a center anode electrode 182, and a top anode electrode 183.

Figure 8E:
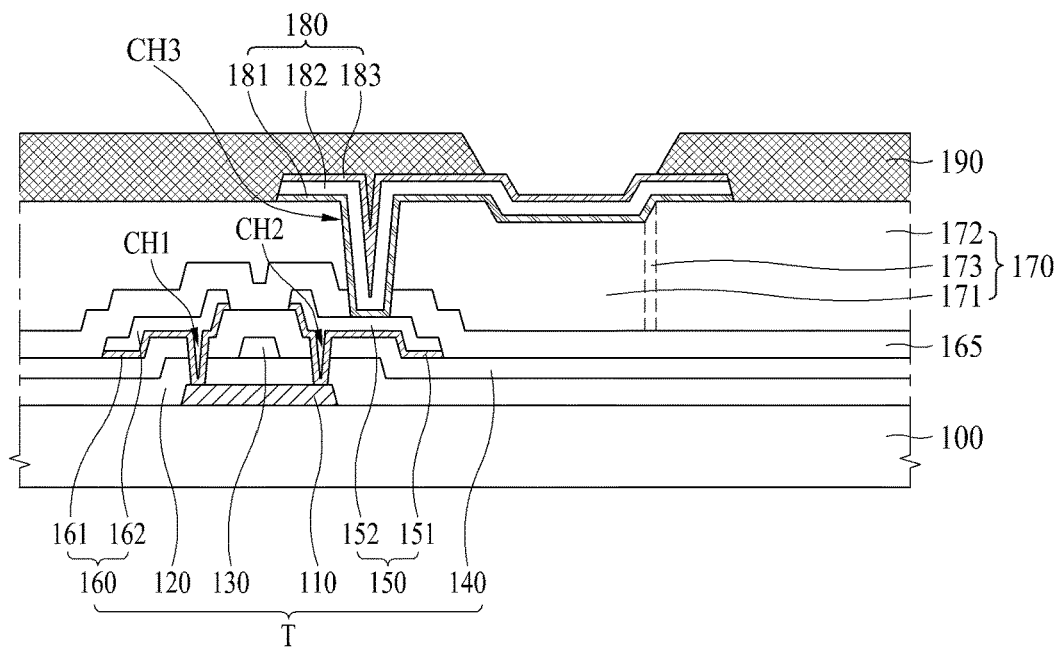

Subsequently, as seen in FIG. 8E, a bank 190 may be formed on the anode electrode 180. The bank 190 may be formed on one side and the other side of the anode electrode 180 to expose an upper surface of the anode electrode 180. In the organic light emitting display device according to another aspect of the present disclosure, the bank 190 may be formed of a black bank. In this case, the bank 190 may be formed to expose the upper surface of the anode electrode 180 provided in the third area 173 as well as the first area 171 of the planarization layer 170, thereby securing an area on which an image is displayed.

However, in a case where the bank 190 is provided on the upper surface of the anode electrode 180 in the third area 173 of the planarization layer 170, if the bank 190 is the black bank, light which is emitted from the organic light emitting layer 200 and moves to a side surface of the organic light emitting layer 200 may be absorbed by the black bank before being reflected by the anode electrode 180 in the third area 173, and for this reason, it is unable to improve emission efficiency.

Therefore, in the method of manufacturing the organic light emitting display device according to another aspect of the present disclosure, if the bank 190 is formed of the black bank, the bank 190 may be provided in only the second area 172 without being provided in the third area 173 corresponding to an inclined area of the planarization layer 170, thereby causing light to be reflected by the anode electrode 180 in the third area 173.

Figure 8F:
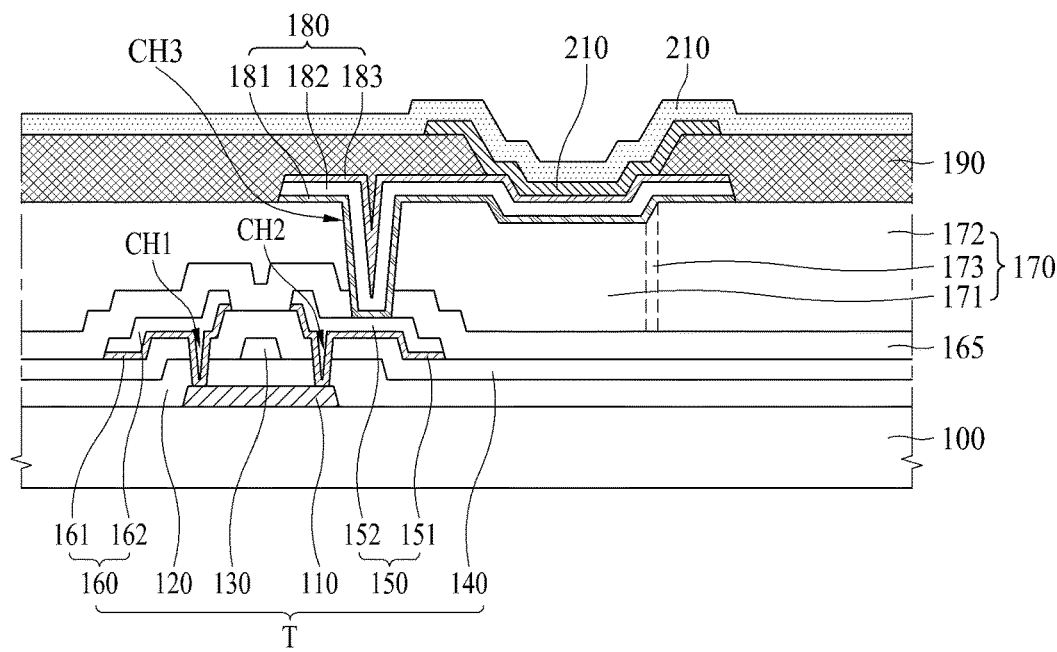

Subsequently, as seen in FIG. 8F, an organic light emitting layer 200 and a cathode electrode 210 may be sequentially formed on the anode electrode 180. The organic light emitting layer 200 may be directly formed on the upper surface of the anode electrode 180 in the first area 171 and the third area 173 of the planarization layer 170, and the cathode electrode 210 may be formed on a whole upper surface of the organic light emitting layer 200 along with the anode electrode 180 so that the cathode electrode 210 repeatedly reflects light reflected by the organic light emitting layer 200 to achieve a micro-cavity effect.

According to another aspect of the present disclosure, since the black bank is formed to expose the anode electrode 180 disposed in the third area 173 of the planarization layer 170, emission of light from the organic light emitting layer 200 and reflection of light by the anode electrode 180 may be performed in the third area 173, thereby enhancing emission efficiency.

As described above, according to the aspects of the present disclosure, the planarization layer may be provided to have a step height in a certain area, the flatness of the emission surface may be maintained, and the anode electrode may be provided on an inclined surface of an area where the step height is provided, thereby reflecting light moving to the side surface of the organic light emitting layer to enhance emission efficiency.

Moreover, according to the aspects of the present disclosure, a black bank is prevented from being formed on an inclined surface of an area where a step height is provided, and thus, the light moving to the side surface of the organic light emitting layer is prevented from being absorbed by the black bank.

Moreover, according to the aspects of the present disclosure, the anode electrode, the organic light emitting layer, and the cathode electrode may be sequentially formed on an inclined surface of the planarization layer where the black bank is not provided, and thus, light may be emitted and moreover reflected from the inclined surface of the planarization layer, thereby enhancing emission efficiency.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device comprising:
a thin film transistor (TFT) including a gate electrode and a source electrode provided on a substrate;
a planarization layer disposed on the TFT and having a step height, wherein the step height is smaller than a total height of the planarization layer;
an anode electrode on the planarization layer and connected to the source electrode;
an organic light emitting layer on the anode electrode; and
a cathode electrode on the organic light emitting layer,
wherein the planarization layer comprises a first area and a second area, each having different step heights, and a third area having an inclined surface between the first area and the second area, and the first area is disposed in an emission area of the organic light emitting display device,
wherein the anode electrode is provided in the first and third areas, the first area having a height less than that of the second area, and
wherein the organic light emitting layer and the cathode electrode overlap the anode electrode in the first area and the third area.

2. The organic light emitting display device of claim 1, further comprising a bank provided on the anode electrode and disposed over the first and second areas, and vertically overlapping the anode electrode, the organic light emitting layer, and the cathode electrode in the third area.

3. The organic light emitting display device of claim 1, further comprising a black bank provided on the anode electrode and disposed over the second area, wherein the black bank does not overlap the anode electrode, the organic light emitting layer, and the cathode electrode in the third area.

4. A method of manufacturing an organic light emitting display device, the method comprising:
forming a gate electrode on a substrate;
forming an interlayer dielectric on the gate electrode;
forming a source electrode on the interlayer dielectric;
forming a planarization layer on the source electrode to have first, second and third areas, each having different step heights, and the third area having an inclined surface between the first and second areas;
forming an anode electrode on the planarization layer to connect to the source electrode;
forming an organic light emitting layer on the anode electrode; and
forming a cathode electrode on the organic light emitting layer,
wherein the anode electrode is provided in the first and third areas, the first area having a height less than that of the second area, and
wherein the organic light emitting layer and the cathode electrode overlap the anode electrode in the first area and the third area.

5. The method of claim 4, wherein the forming of the planarization layer comprises:
forming a planarization material layer, including a positive type photosensitive material, on the source electrode;
irradiating light on the planarization material layer by using a mask which includes a light blocking pattern blocking the light, a first semi-transmissive pattern through which some of the light is non-uniformly transmitted, and a second semi-transmissive pattern through which some of the light is uniformly transmitted;

developing the planarization material layer to form a planarization material pattern having the different step heights; and forming the planarization layer by using the planarization material pattern which remains.

6. The method of claim 5, wherein the forming of the planarization material pattern comprises forming a planarization material pattern corresponding to the second area by using the light blocking pattern, forming a planarization material pattern corresponding to the third area by using the first semi-transmissive pattern, and forming a planarization material pattern corresponding to the first area by using the second semi-transmissive pattern, and the first semi-transmissive pattern comprises a pattern which increases an amount of transmitted light in a direction from an area adjacent to the light blocking pattern to an area adjacent to the second semi-transmissive pattern so that the third area includes an inclined surface.

7. The method of claim 4, further comprising forming a bank on each of one side and another side of the anode electrode prior to the forming of the organic light emitting layer, wherein the forming of the bank comprises forming the bank in the second area and the third area.

8. The method of claim 4, further comprising forming a black bank on each of one side and another side of the anode electrode prior to the forming of the organic light emitting layer, wherein the forming of the black bank comprises forming the black bank in the second area.

9. An organic light emitting display device comprising:
a thin film transistor (TFT) including a gate electrode and a source electrode provided on a substrate;
a planarization layer disposed on the TFT and having first, second, and third areas, wherein each area has different step heights to form a micro-cavity structure, and the first area is disposed in an emission area of the organic light emitting display device;
an anode electrode on the planarization layer and connected to the source electrode;
an organic light emitting layer on the anode electrode; and
a cathode electrode on the organic light emitting layer,
wherein the anode electrode is provided in the first and third areas, the first area having a height less than that of the second area, and
wherein the organic light emitting layer and the cathode electrode overlap the anode electrode in the first area and the third area.

10. The organic light emitting display device of claim 9, further comprising a bank provided on the anode electrode in the first and second areas, and vertically overlap the anode electrode, the organic light emitting layer, and the cathode electrode in the third area.

11. The organic light emitting display device of claim 9, further comprising a black bank provided on the anode electrode in the third area, and does not overlap the anode electrode, the organic light emitting layer, and the cathode electrode in the third area.

12. The organic light emitting display device of claim 11, wherein the second area is disposed in the emission area of the organic light emitting display device.

13. The organic light emitting display device of claim 11, wherein the anode electrode contacts the organic light emitting layer in the first and second areas.

14. The organic light emitting display device of claim 9, the third area is disposed between the first area and the second area and has an inclined surface.

15. The organic light emitting display device of claim 9, wherein the organic light emitting layer has a shape corresponding to the micro-cavity structure.

16. The organic light emitting display device of claim 9, wherein the anode electrode reflect light emitted from the organic light emitting layer, which moves to lateral directions to an upward direction.

* * * * *